US008914243B2

(12) United States Patent
Hirai et al.

(10) Patent No.: US 8,914,243 B2
(45) Date of Patent: Dec. 16, 2014

(54) METHOD FOR CALCULATING NUMBER OF HEALTHY STRINGS OF SODIUM-SULFUR BATTERY AND FAILURE DETECTION METHOD USING SAME

(75) Inventors: Naoki Hirai, Nagoya (JP); Motohiro Fukuhara, Nagoya (JP)

(73) Assignee: NGK Insulators, Ltd., Nagoya (JP)

(*) Notice: Subject to any disclaimer, the term of this patent is extended or adjusted under 35 U.S.C. 154(b) by 487 days.

(21) Appl. No.: 13/278,462

(22) Filed: Oct. 21, 2011

(65) Prior Publication Data

US 2012/0041690 A1 Feb. 16, 2012

Related U.S. Application Data

(63) Continuation of application No. PCT/JP2010/058340, filed on May 18, 2010.

(30) Foreign Application Priority Data

May 20, 2009 (JP) .................................. 2009-122349

(51) Int. Cl.
- *G01N 31/00* (2006.01)
- *H01M 6/42* (2006.01)
- *H01M 10/48* (2006.01)
- *H01M 10/39* (2006.01)
- *G01R 31/36* (2006.01)

(52) U.S. Cl.
CPC ............ *H01M 10/3909* (2013.01); *H01M 6/42* (2013.01); *G01R 31/3658* (2013.01); *G01R 31/3679* (2013.01); *H01M 10/48* (2013.01)
USPC .......................................................... 702/30

(58) Field of Classification Search
None
See application file for complete search history.

(56) References Cited

U.S. PATENT DOCUMENTS

| 4,886,715 | A  | * | 12/1989 | McCullough et al. | ........ 429/103 |
| 5,227,259 | A  |   | 7/1993  | Weaver et al.     |                  |
| 8,463,449 | B2 | * | 6/2013  | Sanders           | ........ 700/286 |

FOREIGN PATENT DOCUMENTS

| CN | 1862279 A      | 11/2006 |
| JP | 05-240890 A1   | 9/1993  |
| JP | 05-250980 A1   | 9/1993  |
| JP | 08-050930 A1   | 2/1996  |
| JP | 3505116 B2     | 3/2004  |
| JP | 2004-247319 A1 | 9/2004  |
| KR | 2007 0101496 A1| 10/2007 |

OTHER PUBLICATIONS

Chinese Office Action dated Jul. 3, 2013.
Extended European Search Report dated Jan. 2, 2013.

* cited by examiner

*Primary Examiner* — Aditya Bhat
(74) *Attorney, Agent, or Firm* — Burr & Brown, PLLC

(57) ABSTRACT

A number (uo) of healthy strings of one block in a sodium-sulfur battery is determined according to expression (1), and a failure of the sodium-sulfur battery is detected on the basis of the determination of the value of the uo. This method makes it possible to properly determine a failure of the sodium-sulfur battery, which can be used to compensate for fluctuations of electric power generated by a renewable energy generating device. $uo=(Qo/Qs)\times us \ldots$ (1) where Qs: used capacity of reference block; Qo: used capacity of target block; and us: number of healthy strings of reference block ($us \leq u$).

6 Claims, 4 Drawing Sheets

METHOD FOR CALCULATING NUMBER OF HEALTHY STRINGS OF SODIUM-SULFUR BATTERY AND FAILURE DETECTION METHOD USING SAME

CROSS-REFERENCE TO RELATED APPLICATIONS

This application is a continuation of International Application No. PCT/JP2010/058340, filed May 18, 2010, which claims the benefit under 35 USC §119(a)-(d) of priority from Japanese Patent Application No. 2009-122349 filed May 20, 2009.

BACKGROUND OF Tat INVENTION

1. Field of the Invention

The present invention relates to a method for determining the number of healthy strings in each block for each module of a sodium-sulfur battery and a method for detecting a failure for each module of the sodium-sulfur battery by using the same.

2. Description of Related Art

A sodium-sulfur battery is expected to see a wider use as an electric power storage device in application fields, such as electric power load leveling, measures against a momentary drop in power, and compensation for fluctuations in the power generated by a renewable energy generating device.

In the application of the load leveling, the operating cycle of the sodium-sulfur battery consists of, for example, the repetitive cycle of a discharge during the daytime and a charge during the nighttime with a rest between the cycles. In this case, the sodium-sulfur battery reaches the vicinity of the end of a discharge once a day after the discharge during the daytime. Meanwhile, in the application of compensation for fluctuations in electric power, the sodium-sulfur battery repeats a charge and a discharge within a short time so as to compensate for an output (electric power) of a renewable energy generating device.

The aforesaid sodium-sulfur battery is generally configured by connecting a plurality of electric cells in series to form a string, and then connecting a plurality of the strings in parallel to form a block. Further, a plurality of the blocks is connected in series to form a module, and then a plurality of the modules is connected in series to complete the sodium-sulfur battery.

Failure of the sodium-sulfur battery to exhibit its expected performance leads to a problem in the aforesaid applications, such as the load leveling measures against a momentary drop in power, and the compensation for fluctuations in power. It is, therefore, extremely important to detect a failure of the sodium-sulfur battery.

Hitherto, a failure of the sodium-sulfur battery is detected by measuring the voltage of each block when the voltage of the battery is stabilized during the period of a rest from the completion of a discharge to the start of a charge and then by determining whether the voltage of the block is out of a set range or whether a voltage difference between blocks is out of a set range. As described above, the block is formed by connecting in parallel the strings, each of which is formed by connecting electric cells in series. As the documents on prior arts, patent documents 1 and 2, for example, may be cited.

PRIOR ART DOCUMENTS

Patent Documents

Patent Document 1: JP-A-2004-247319
Patent Document 2: JP3505116

SUMMARY OF THE INVENTION

However, a failure of a sodium-sulfur battery is not revealed in terms of a voltage value or a voltage difference until a discharge reaches the vicinity of the end of a discharge, i.e., a great depth of discharge. For this reason, when the sodium-sulfur battery is used for load leveling, the conventional failure detection method provides a chance of detecting a failure only once a day, causing a time delay in detecting a failure when the failure actually occurs.

Further, when the sodium-sulfur battery is used for compensating for fluctuations in electric power, there are few cases where an output that daily reaches the end of a discharge is required. In the application of compensating for fluctuations in electric power, if the sodium-sulfur battery reaches the end of a discharge, then fluctuations in the electric power generated by an electric power generating device cannot be absorbed thereafter (i.e., the sodium-sulfur battery loses its function). It is, therefore, preferred to control the sodium-sulfur battery not to reach the end of a discharge. Thus, in the application of compensating for fluctuations in electric power, a failure of a sodium-sulfur battery cannot be virtually detected by the conventional failure detection method.

Further, after completion of a discharge, it takes a few hours (approximately two hours at the shortest) before the voltage of the sodium-sulfur battery stabilizes. This means that, according to the conventional failure detection method, a few-hour rest is required for a voltage to stabilize. Especially when the battery is used for load leveling, providing such a long period of rest means the need for installing a backup system, which is undesirable cost-wise, in the application of compensating for fluctuations in the power generated by a renewable energy generating device.

The present invention has been made with a view of the background described above and it is an object of the invention to provide a means capable of properly detecting a failure of a sodium-sulfur battery applicable to the compensation for fluctuations in electric power generated by a renewable energy generating device. Studies have revealed that the object can be fulfilled by the following means based on a used capacity rather than a voltage.

The present invention provides a method for calculating the number of healthy strings of a sodium-sulfur battery, whereby to determine a number uo of healthy strings of a block in a sodium-sulfur battery according to expression (1) given below, the sodium-sulfur battery being constituted by forming a string by connecting an s number of (a plurality of) electric cells in series, connecting a u number of (a plurality of) the strings in parallel to form a block, and connecting an n number of (a plurality of) the blocks in series.

$$uo = (Qs/Qo) \times us \quad (1)$$

where
Qs: Used capacity of reference block [Ah]
Qo: Used capacity of target block [Ah]
us: Number of healthy strings of reference block (us≤u)

As described above, a sodium-sulfur battery is generally constituted by further connecting in series a plurality of modules, each of which is constructed of a plurality of blocks. However, in the method for calculating the number of healthy strings of a sodium-sulfur battery and a failure detection method using the same in accordance with the present invention, a unit constituted by connecting a plurality of blocks in series is referred to as a sodium-sulfur battery, and the sodium-sulfur battery refers to a single module (module battery). In other words, the method for calculating the number of healthy strings of the sodium-sulfur battery in accordance with the present invention is a method for calculating the number of healthy strings of each block on a module basis, and the failure detection method in accordance with the present invention is a method for detecting a failure on a module basis. Further, it is obviously possible to determine a failure of the commonly called (entire) sodium-sulfur battery (comprised of a plurality of modules) by detecting a failure of (each) module caused by a failure of an electric cell.

In the method for calculating the number of healthy strings of a sodium-sulfur battery in accordance with the present invention, the number of healthy strings (normal string quantity) is the number of strings composed of electric cells that are not faulty. The target block refers to (one) block in the sodium-sulfur battery on which the number uo of healthy strings is to be determined. Thus, uo may be considered as the number of healthy strings of a target block.

The reference block is the block having a highest voltage among the blocks in the sodium-sulfur battery (module), and the number of healthy strings of the block indicates the number of healthy strings of the reference block. However, the number of healthy strings of the reference block eventually reduces due to the occurrence of a failure of an electrics cell thereof in the history of service. As a result of a failure that has taken place in an electric cell, the reference block (the block having the highest voltage among the blocks in the sodium-sulfur battery (module)) may be replaced by another block. Hence, the number of healthy strings of the reference block used in this case is defined as the immediately preceding number of healthy strings. The term "immediately preceding" means the last time when the method for calculating the number of healthy strings (or the method for detecting a failure) of a target block was implemented.

The initial value of the number of healthy strings of the reference block is, for example, 12. This number remains unchanged as long as the reference block remains the same. On the other hand, however, if an electric cell fails in the block which was the reference block (last time), then the block is no longer the one having the highest voltage among the blocks in the sodium-sulfur battery (module) (as described above). When this happens, the reference block is replaced by another block. The number of the healthy strings of a block to become the new reference block should have been calculated last time (e.g., a numeric value below 12), and the previous numeric value is adopted as the number of healthy strings of the reference block.

In the method for calculating the number of healthy strings of the sodium-sulfur battery in accordance with the present invention, each of the aforesaid used capacity Qs of the reference block and the aforesaid used capacity Qo of the target block is preferably calculated according to expressions (2) and (5) given below in a single-phase region after the completion of a charge/discharge.

$$Qs=Qsn-Qsc \quad (2)$$

where
Qsn: depth of discharge of reference block [Ah]
Qsc: residual capacity of reference block [Ah]

$$Qsn=us \times f1(Vs(t,T,Icd)) \quad (3)$$

where f1(Vs(t, T, Icd)): transform function for determining the depth of discharge of a block having a highest voltage (among the blocks in a sodium-sulfur battery (module)) on the basis of a voltage Vs of the block (The voltage is to be obtained by converting into a stable open-circuit voltage on the basis of an unstable open-circuit voltage measured after t hours following completion of a charge/discharge in the single-phase region and then correcting the converted stable open-circuit voltage on the basis of a temperature T upon completion of a charge/discharge and a charging/discharging current Icd upon completion of a charge/discharge.)

$$Qsc=f2(Cs) \quad (4)$$

where f2(Cs): transform function for determining a current reference block residual capacity Qsc on the basis of an equivalent cycle Cs of a current reference block $$Qo=Qon-Qoc \quad (5)$$

where
Qon: depth of discharge of target block [Ah]
Qoc: residual capacity of target block [Ah]

$$Qon=us \times f3(Vo(t,T,Icd)) \quad (6)$$

where f3(Vo(t, T, Icd)): transform function for determining the depth of discharge of a block, the number of healthy strings of which is to be determined, on the basis of a voltage Vo of the block (among the blocks in a sodium-sulfur battery (module)) (The voltage is to be obtained by converting into a stable open-circuit voltage on the basis of an unstable open-circuit voltage measured after t hours following completion of a charge/discharge in the single-phase region and then correcting the converted stable open-circuit voltage on the basis of a temperature T upon completion of a charge/discharge and a charging/discharging current Icd upon completion of a charge/discharge.)

$$Qoc=f4(Co) \quad (7)$$

where f4(Co): transform function for determining a residual capacity Qoc of a current target block on the basis of an equivalent cycle Co of the current target block The aforesaid used capacity of the reference block Qs and the aforesaid used capacity of the target block Qo are both management values managed by, for example, a control unit of the sodium-sulfur battery. Each of the used capacity of the reference block Qs and the used capacity of the target block Qo can be reset to 0 [Ah] at an end of a charge of the sodium-sulfur battery.

In the method for calculating the number of healthy strings of a sodium-sulfur battery and the method for detecting a failure by using the same in accordance with the present invention, the term "current" refers to the time at which a certain value is to be determined (calculated). The depth of discharge is a numeric value denoting a discharge state of a battery and the unit thereof is [Ah]. The depth of discharge [Ah] corresponds to a (currently) used capacity (discharge amount) in a certain state relative to a product capacity including a residual capacity. The depth of discharge [Ah] also includes a residual capacity. The depth of discharge [Ah], which is not a management value, has a fixed relationship with voltage (refer to FIG. 2; this will be discussed latex), and is a value determined from the voltage of the sodium-sulfur battery. The residual capacity [Ah] is a capacity in the product capacity that cannot be used for a charge, thus meaning that it is a capacity that cannot be used (discharged). The residual capacity [Ah] increases with age.

The present invention provides a method for detecting a failure of a sodium-sulfur battery, whereby to detect a failure of a sodium-sulfur battery by determining the value of the number uo of healthy strings of the aforesaid (target) block by using one of the methods for calculating the number of healthy strings of a sodium-sulfur battery described above.

For example, a failure determination value is determined in advance, and uo is compared with the failure determination value. If uo lowers to the failure determination value or less, then it can be determined that a failure of the sodium-sulfur battery has been detected (or determined that the sodium-sulfur battery has failed).

The method for detecting a failure of a sodium-sulfur battery in accordance with the present invention is ideally used in the case where the sodium-sulfur battery, a failure of which is to be detected, is a sodium-sulfur battery which constitutes an electric power storage-compensation device to compensate for output fluctuations in an electric power generating device in an interconnected system, which combines the electric power generating device incurring output fluctuations and the electric power storage-compensation device to supply power to a power system.

In the method for calculating the number of healthy strings of a sodium-sulfur battery according to the present invention, whether (a sodium-sulfur battery) is in a single-phase region is determined by determining whether the region is a region in which a voltage falls in the relationship between a depth of discharge and a voltage (which will be discussed in more detail hereinafter). Alternatively, a determination voltage for determining whether a region is a single-phase region may be set beforehand so as to determine that a certain region is a single-phase region if the voltage thereof falls to the preset voltage or less. In this case, the value of the determination voltage may be set to be slightly lower by a predetermined value than a certain voltage in a two-phase region.

In the method for calculating the number of healthy strings of a sodium-sulfur battery according to the present invention, temperature means a battery operating temperature or more specifically, the temperature in a module during an operation.

The voltages, currents, depths, capacities (electrical quantities) and the like in the present description are denoted in terms of expressions or the like, showing the references, such as blocks. It is needless to say, however, that there are cases where they can be mutually converted into other values or quantities of references, as necessary. The references refer mainly to electric cells, blocks, and modules (the sodium-sulfur battery in the method for calculating the number of healthy strings of a sodium-sulfur battery and the method for detecting a failure by using the same in accordance with the present invention).

The method for calculating the number of healthy strings of a sodium-sulfur battery in accordance with the present invention determines the number uo of healthy strings of a target block according to expression (1) given above. As understood from this expression (1), the method for calculating the number of healthy strings of a sodium-sulfur battery in accordance with the present invention determines the number of healthy strings of a target block on the basis of the ratio between the used capacity of a reference block and that of the target block.

It is assumed that the depth of discharge of the reference block is determined from the open-circuit voltage after completion of a charge/discharge of the reference block and the number of healthy strings of the reference block, and also, the depth of discharge of the target block is determined from the open-circuit voltage after completion of a charge/discharge of the target block and the number of strings of the reference block. Normally, the number of the strings of the target block should be used to determine the depth of discharge of the target block, but the number of the strings of the target block is unknown. Hence, the reference block is defined as the block having the highest voltage in the sodium-sulfur battery, and the immediately preceding data (the initial value being, for example, 12) of the number of healthy springs of the reference block is used to calculate the depth of discharge. If the number of healthy strings of the target block is the same as the number of healthy strings of the reference block, then the depth of discharge should take (approximately) the same value. If, however, the number of healthy strings of the target block is smaller than the number of healthy strings of the reference block (because the number of strings of the reference block was used to determine the depth of discharge of the target block), then the calculated depth of discharge of the target block turns out to be larger than the depth of discharge of the reference block. In other words, the number of healthy strings of the target block can be determined on the basis of the ratio between the calculated depths of the reference block and the target block and the number of healthy strings of the reference block. However, the difference in depth in actual blocks is accrued by a discharge (when used), so that the method for calculating the number of healthy strings of a sodium-sulfur battery according to the present invention employs a used capacity that does not include a residual capacity rather than a depth of discharge itself.

As described above, the method for calculating the number of healthy strings of a sodium-sulfur battery in accordance with the present invention uses the ratio of used capacity between the reference block and the target block. This obviates the need for discharging to a great depth, i.e., the vicinity of the end of a discharge, and the number uo of healthy strings can be calculated in a state where a discharge has reached a level of entering the single-phase region (even immediately after a charge). Further, the method for detecting a failure of a sodium-sulfur battery in accordance with the present invention determines the value of the number uo of healthy strings of the aforesaid block thereby to detect a failure of the sodium-sulfur battery. This makes it possible to detect a failure even if, for example, control is conducted not to reach the end of a discharge when used for compensating for fluctuations in electric power.

The method for calculating the number of healthy strings of a sodium-sulfur battery in accordance with the present invention determines the depth of discharge on the basis of a voltage measured in t hours after completion of a charge/discharge, then a residual capacity is subtracted from the determined depth of discharge so as to determine a used capacity, as indicated by the transform functions in expression (3) and expression (6). Thus, a prolonged period of rest for a voltage to fully stabilize is not required when calculating the number uo of healthy strings. Therefore, the method for calculating the number of healthy strings of a sodium-sulfur battery in accordance with the present invention is ideal as a means for calculating the number of healthy strings of a sodium-sulfur battery applied to the compensation for fluctuations in electric power generated by a renewable energy generating device. Further, the method for detecting a failure of a sodium-sulfur battery in accordance with the present invention detects a failure of a sodium-sulfur battery by determining the value of the number uo of healthy strings of the aforesaid block, making the method ideal as a means for detecting a failure of a sodium-sulfur battery applied to, for example, the compensation for fluctuations in electric power generated by a renewable energy generating device.

DETAILED DESCRIPTION OF THE INVENTION

Figure 1:
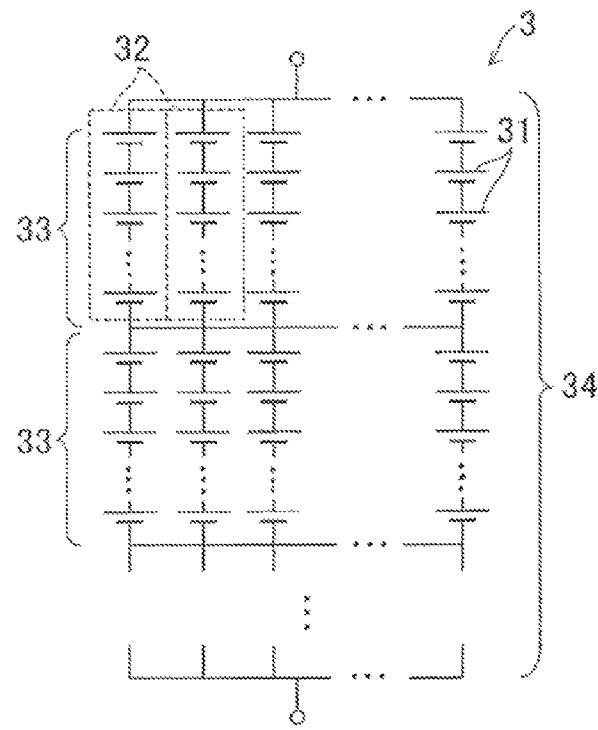
FIG. 1 is a circuit diagram illustrating an example of a sodium-sulfur battery (module).

The following will describe embodiments of the present invention with reference to the accompanying drawings, as necessary. However, the embodiments are not deemed to limit the interpretation of the present invention. Various changes, modifications, improvements, or replacements may be added according to the knowledge of persons skilled in the art within the spirit and scope of the present invention. For example, although the accompanying drawings illustrate preferred embodiments of the present invention, the present invention is not limited by the embodiments illustrated in the drawings or information given in the drawings. To embody or verify the present invention, the same or equivalent means as or to the means described in the present description may be applied. However, preferred means are the ones described below.

Figure 2:
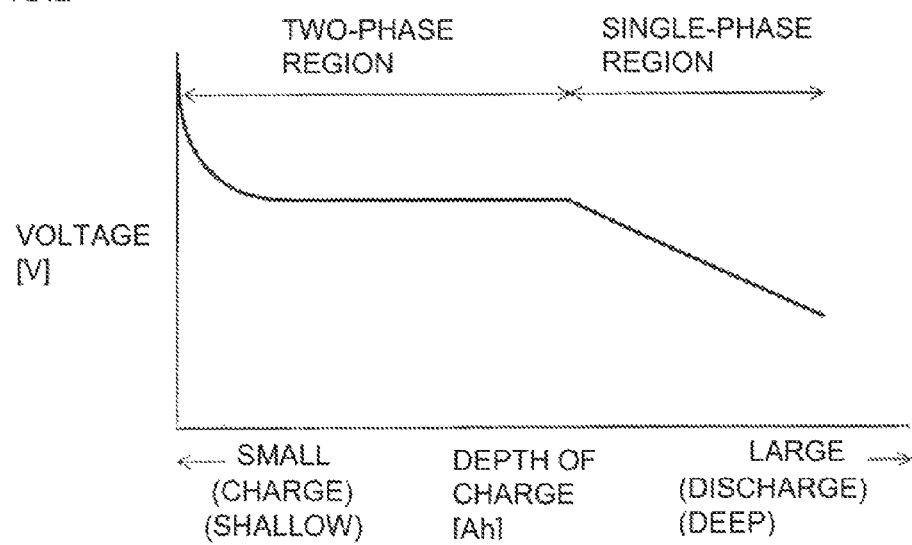
FIG. 2 is a graph illustrating the relationship between the depth of discharge and the voltage of the sodium-sulfur battery.
Figure 3:
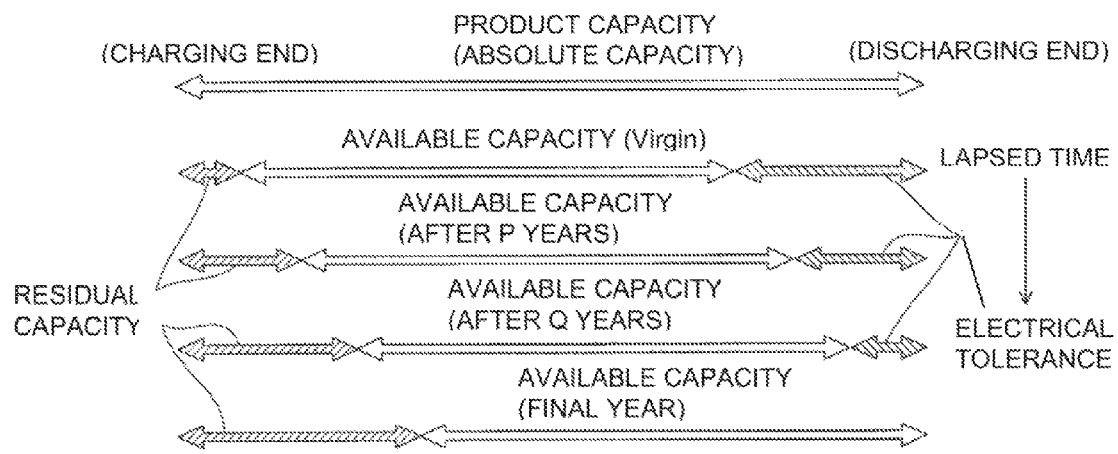
FIG. 3 is a conceptual diagram illustrating the age deterioration of the sodium-sulfur battery, wherein a residual capacity increases as time elapses (downward).

First, with reference to FIG. 1 to FIG. 3, the construction and applications of a sodium-sulfur battery will be exemplified, and general principle and operation thereof will be explained. FIG. 1 is a circuit diagram illustrating an example of a sodium-sulfur battery (module). FIG. 2 is a graph illustrating the relationship between the depth of discharge and the voltage of the sodium-sulfur battery. FIG. 3 is a conceptual diagram illustrating the age deterioration of the sodium-sulfur battery.

A sodium-sulfur battery 3 is composed of a module 34 shown in FIG. 1. The module 34 is constructed of a plurality of (an n number of) blocks 33 connected in series, each of the blocks 33 is constructed of a plurality of (a u number of) strings 32 connected in parallel, and each of the strings 32 is constructed of a plurality of (an s number of) electric cells 31 connected in series.

The electric cell 31 has a molten metal sodium, which is a cathode active material, and a molten sulfur, which is an anode active material. The cathode active material and the anode active material are isolated by a beta alumina solid electrolyte, which has selective permeability with respect to sodium ions. The sodium-sulfur battery is a high-temperature secondary battery operated at about 280° C. to about 350° C. (around 300° C.). At the time of a discharge, the molten sodium emits electrons and becomes a sodium ion, which moves to the anode side through a solid electrolyte tube so as to react with sulfur and electrons having passed through an external circuit to generate sodium polysulfide, thereby generating a voltage of approximately 2V in the electric cell 31.

Reversely from a discharge, the production reaction between sodium and sulfur takes place in a charge. The operating cycle of the sodium-sulfur battery consists of the repetition of a cycle of the aforesaid discharge and charge with a rest between the cycles when the battery is used in, for example, load leveling.

As illustrated in FIG. 2, the voltage (e.g., a block voltage) while the sodium-sulfur battery is in operation remains almost constant when fully charged except for the vicinity of the end of a charge. The voltage clearly rises toward the end of the charge and clearly falls as the discharge proceeds, with a reduction in the molar proportion of sulfur. In the sodium-sulfur battery, the composition of the sodium polysulfide generated at the positive electrode changes according to a depth of discharge. The changes in the composition are indicated in terms of the value of "x" of "$Na_2S_x$." In a fully charged state, the positive electrode provides a two-phase region wherein S and $Na_2S_5$ coexist. In the two-phase region, a certain electrochemical reaction continues and the voltage remains constant except in the vicinity of the end of the charge wherein the voltage rises as internal resistance increases (the region showing a flat relationship between the depth of discharge and the voltage in FIG. 2). As the discharge proceeds, the discrete S runs out, causing the positive electrode to turn into a single-phase region wherein $Na_2S_x$ (x<5) applies (a region showing a descending relationship between the depth of discharge and the voltage in FIG. 2). In the single-phase region, the molar proportion of sulfur reduces ("x" reduces) and the voltage drops substantially linearly as the discharge proceeds. When the discharge further proceeds, causing x to be 3 or less, a solid phase having a high melting point ($Na_2S_2$) is generated, preventing any further discharge.

As with many other secondary batteries, the product capacity (the absolute capacity or the rated capacity) of a sodium-sulfur battery is fixed, as illustrated in FIG. 3. However, a sodium-sulfur battery has a small residual capacity from the beginning when it is brand-new, and cannot be fully charged to 100% of the product capacity, and the (ageing) residual capacity that prevents a full charge increases as time passes. For this reason, in designing a sodium-sulfur battery, an electrical tolerance is considered for an available capacity, so that the electrical tolerance is considered for an available capacity so as to compensate for an increase in the residual capacity thereby to secure the available capacity until the final year (expected life) is reached. The electrical tolerance in each year is indicated by the capacity obtained by subtracting the residual capacity in each year from the residual capacity in the final year (zero (no) electrical tolerance). As illustrated in FIG. 3, the product capacity=available capacity+residual capacity+electrical tolerance. The used capacity in the present invention is a capacity that depends on the situation of a charge or discharge within the range of the available capacity.

A description will now be given of the method for calculating the number of healthy strings of a sodium-sulfur battery in accordance with the present invention by taking, as an example, the case of the sodium-sulfur battery 3 illustrated in FIG. 1. The number (the series number) of the blocks 33 constituting the module 34 in the sodium-sulfur battery 3 is four, the number (the parallel number) of the strings 32 constituting the block 33 is twelve, and the number (the series number) of the electric cells 31 constituting the string 32 is eight.

According to the method for calculating the number of healthy strings of a sodium-sulfur battery in accordance with the present invention, the number uo of healthy strings of a target block (one block) of a sodium-sulfur battery is determined according to expression (1') given below.

$$uo=(Qs/Qo) \times us \quad (1')$$

where
Qs: used capacity of reference block [Ah]
Qo: used capacity of target block [Ah]
us: number of healthy strings of reference block (initial value: 12)

"us" denotes the number of healthy strings of a block (reference block) having a highest voltage among the blocks in a module and denotes the number of healthy strings calculated last time. The initial value is 12 (no string with a faulty electric cell exists) and remains 12 unless the reference block is replaced by another one. However, if a failure of an electric cell occurs and the reference block is replaced, then the number of healthy strings of a new reference block is a value below 12, which is the number of healthy strings calculated as a target block (rather than a reference block) last time.

If the value of the number uo of healthy strings of the target block becomes, for example, a failure determination value 10 or less, then it is determined that the sodium-sulfur battery 3 has failed. In other words, if, for example, the number (parallel number) of normal (sound) strings 32 becomes 10 (rows) or less out of the total 12, then it indicates that a failure of the sodium-sulfur battery has been detected.

The method for calculating the number of healthy strings of a sodium-sulfur battery in accordance with the present invention determines the number uo of healthy strings of a target block on the basis of the ratio between the used capacity of Qs of a reference block and the used capacity of Qo of a target block, so that the number uo of healthy strings of the target block does not necessarily take a natural number. For a failure determination value, a real number, including one after the decimal point, such as 10.5 or 9.8, may be set.

Further, the used capacity Qs of the reference block in expression (1') is calculated according to expression (2) given below when the single-phase region is reached after completion of a charge/discharge.

$$Qs=Qsn-Qsc \quad (2)$$

where
Qsn: depth of discharge of reference block [Ah]
Qsc: residual capacity of reference block [Ah]

The depth of discharge of the reference block Qsn [Ah] in expression (2) is determined according to expression (3') given below. In expression (3'), "us" denotes the number of healthy strings 32 (initial value: 12) constituting the reference block.

$$Qsn=us \times f1(Vs(0.5, T, Icd)) \quad (3')$$

where f1 (Vs (0.5, T, Icd)): transform function for determining the depth of discharge [Ah] of a block 33 having a highest voltage [V] on the basis of a voltage Vs [V] of the block 33 (The voltage [V] is to be obtained by converting into a stable open-circuit voltage [V] on the basis of an unstable open-circuit voltage [V] measured after 30 minutes (0.5 hours) following completion of a charge/discharge in the single-phase region and then correcting the converted stable open-circuit voltage [V] on the basis of a temperature T[° C.] upon completion of the charge/discharge and a charging/discharging current Icd[A] upon completion of the charge/discharge.)

The voltage of the sodium-sulfur battery 3 stabilizes in two to four hours after completion of a discharge, so that the depth of discharge can be easily calculated by measuring the open-circuit voltage at the end of the (true) discharge at the point of time in the block. However, it is difficult to hold the battery at rest for such a long time especially when used for compensating for fluctuations in the electric power generated by a renewable energy generating device. Hence, the method for calculating the number of healthy strings of the sodium-sulfur battery in accordance with the present invention uses a means for determining the (true, stabilized) open-circuit voltage at the end of a discharge on the basis of the transient voltage indicated by the sodium-sulfur battery after completion of a charge/discharge. This applies also for determining a target block depth of discharge Qon, which will be discussed hereinafter.

To be more specific, for the measurement of the voltage of the block 33 in the module 34, the open-circuit voltage [V] (unstable open-circuit voltage) of the block 33 is measured (for example) 30 minutes (=t hours) after completion of a charge/discharge in a single-phase region (refer to FIG. 2). The open-circuit voltage at this time is referred to as the 30-minute rest OCV (Open Circuit Voltage). Then, the 30-minute rest OCV is converted into the open-circuit voltage [V] (stabilized open-circuit voltage) of the block 33 after the elapse of, for example, two hours. This open-circuit voltage is referred to as the 2-hour rest OCV and considered to be the true open-circuit voltage value (before the correction based on the temperature and the charging/discharging current).

Figure 4:
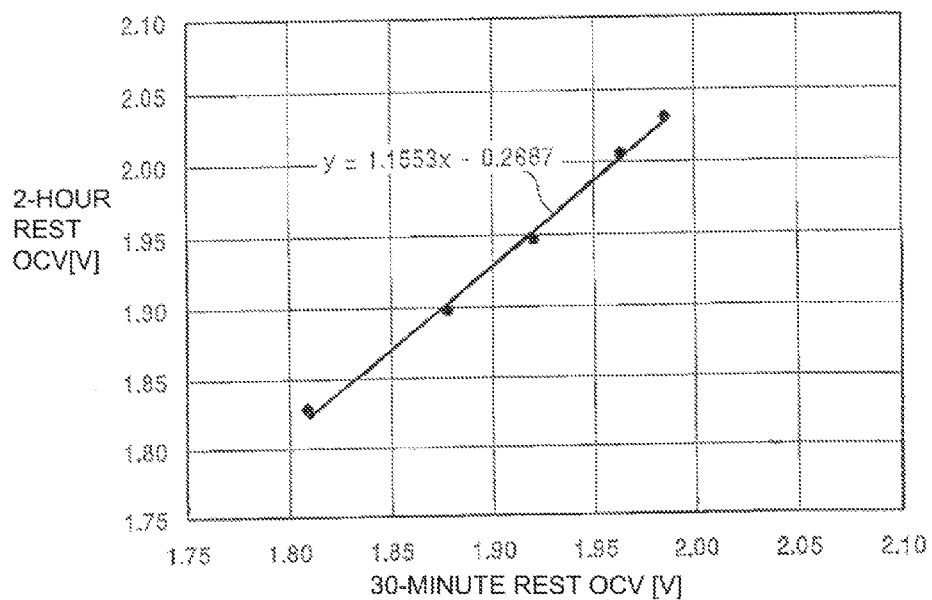
FIG. 4 is a graph illustrating the relationship between 30-minute rest OCV and 2-hour rest ( )V after completion of a charge/discharge in a single-phase region.

The conversion can be accomplished on the basis of the relationship illustrated in FIG. 4. In the expression (y=1.1553x−0.2667) shown in FIG. 4, x denotes the 30-minute rest OCV, and y denotes the 2-hour rest OCV (the true open-circuit voltage before correction). In FIG. 4, as is obvious from the numeric values on the axis of ordinates and the axis of abscissas, the 2-hour rest OCV and the 30-minute rest OCV are both expressed as the OCVs of electric cells. Needless to say, the equation (conversion equation) shown in FIG. 4 can be applied also to the OCVs of blocks.

Figure 5:
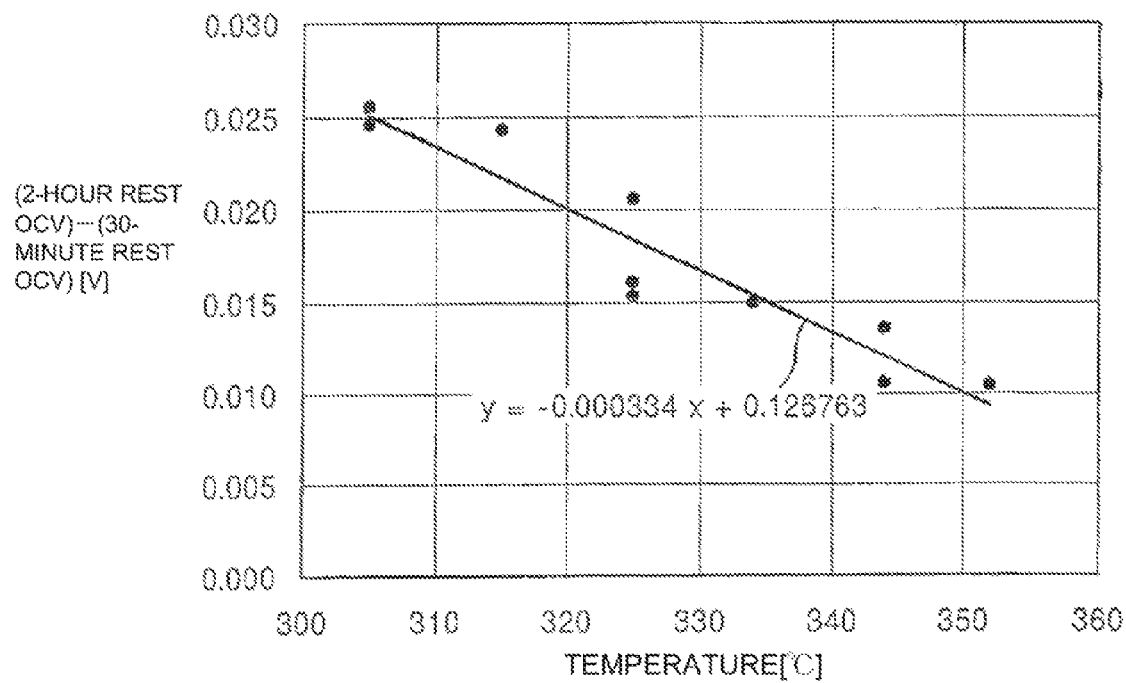
FIG. 5 is a graph illustrating the relationship between the temperature upon completion of a charge/discharge and the value of (2-hour rest OCV −30-minute rest OCV) after completion of the charge/discharge in the single-phase region.
Figure 6:
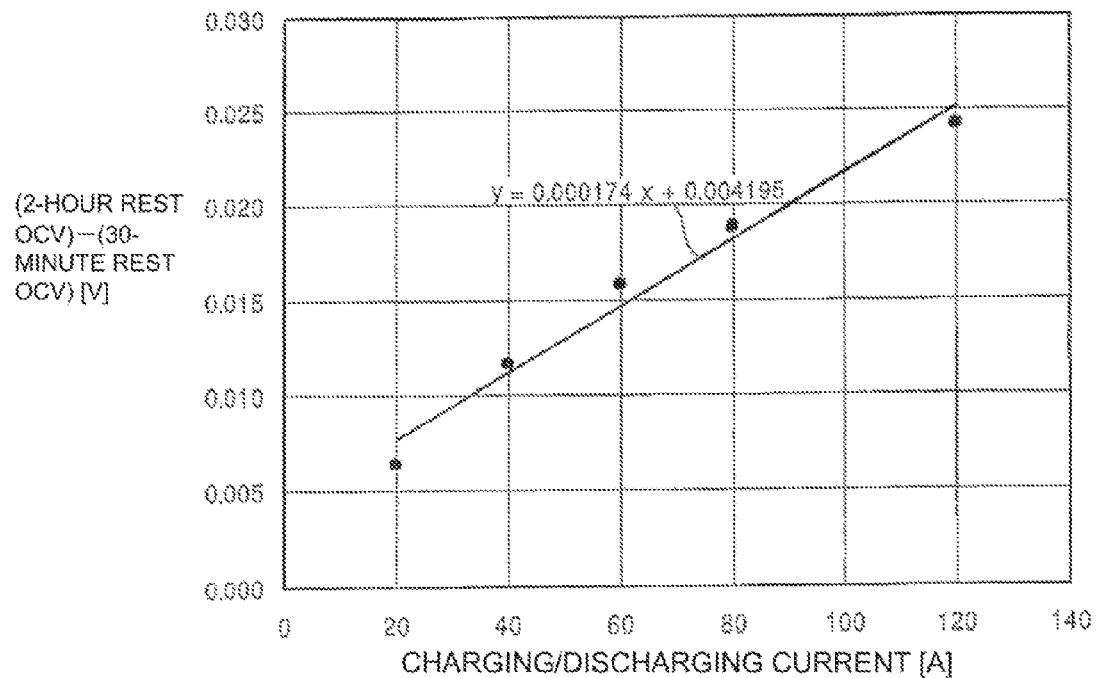
FIG. 6 is a graph illustrating the relationship between the charging/discharging current upon completion of the charge/discharge and the value of (2-hour rest OCV−30-minute rest OCV) after completion of the charge/discharge in the single-phase region.

Further, a correction is made on the basis of the temperature T[° C.] upon completion of the charge/discharge and the charging/discharging current Icd [A] to determine the true open-circuit voltage value of the block 33. As illustrated in FIG. 5 and FIG. 6, the correction can be accomplished on the basis of the fact that the value of (the 2-hour rest OCV−the 30-minute rest OCV)[V] and the temperature T[° 1C] and the charging/discharging current [A] have a predetermined relationship. The value of (the 2-hour rest OCV−the 30-minute rest OCV)[V] is a correction value (a value to be corrected), and a target of the correction is the 2-hour rest OCV (before correction, electric cell OCV) [V] determined on the basis of the 30-minute rest OCV.

In the expression (y=−0.000334x+0.126763) shown in FIG. 5, x denotes temperature and y denotes (the 2-hour rest OCV−the 30-minute rest OCV). According to FIG. 5, if the temperature rises by, for example, 10° C., then a correction of approximately −0.004V (−4 mV) is required.

In the expression (y=0.000174x+0.004195) shown in FIG. 6, x denotes charging/discharging current and y denotes (the 2-hour rest OCV−the 30-minute rest OCV). Referring to FIG. 6, if the charging/discharging current increases by, for example, 10 A, then a correction of approximately +0.003V (3 mV) is required.

For the correction based on the charging/discharging current Icd in the method for calculating the number of healthy strings of a sodium-sulfur battery in accordance with the present invention, the direction of the discharging current is defined as positive, while the direction of the charging current is defined as negative. FIG. 6, which shows positive current values on the axis of abscissas, substantially indicates the discharging current. In the case of the charging current, current values take negative values, which are not shown in FIG. 6. However, the same relationship between the charging/discharging current and (the 2-hour rest OCV–the 30-minute rest OCV) applies to the case of the charging current (y=0.000174x+0.004195). In the state wherein a discharge has reached a level of entering the single-phase region, a correction based on the charging/discharging current Icd [A] can be made even immediately after a charge:

The voltages of the blocks 33 existing in the module 34 are determined to find the block 33 having a highest voltage. Then, the voltage [V] of the block 33 having the highest voltage is converted into the depth of discharge [Ah]. The voltage is based on a voltage measured in the single-phase region, so that the voltage [V] can be converted into the depth of discharge [Ah] (refer to FIG. 2). The obtained depth of discharge (capacity) is based on the voltage of the block 33 and therefore equivalent to the capacity of a single string 32. Thus, multiplying the depth of discharge by "us," which is the number of the strings 32, determines the depth of discharge of the block 33 having the highest voltage. This is the reference block depth of discharge Qsn [Ah].

Figure 7:
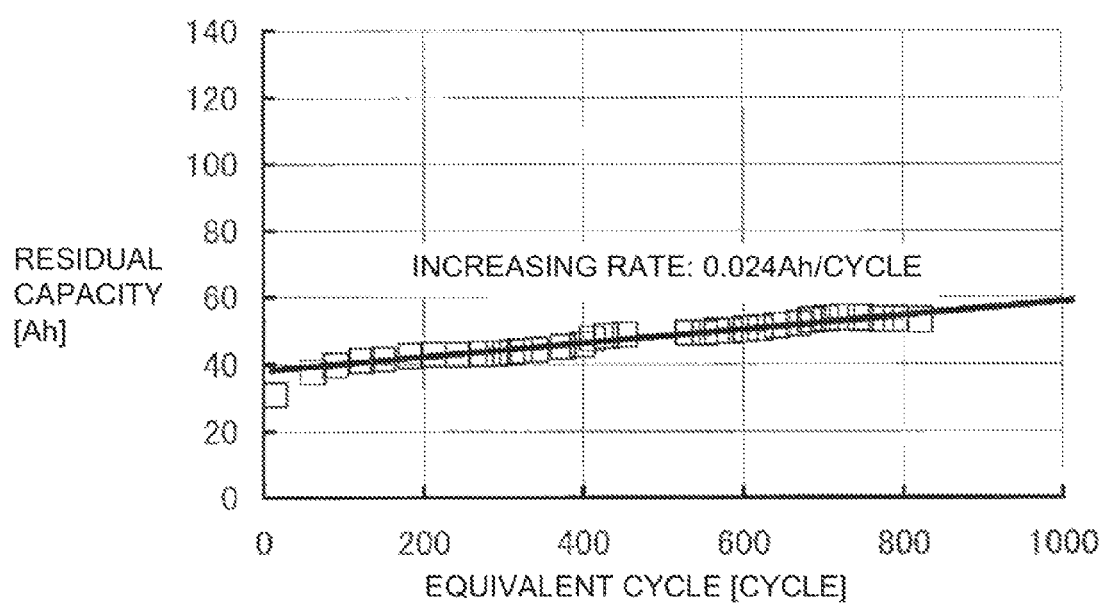
FIG. 7 is a graph illustrating the relationship between a residual capacity [Ah] and an equivalent cycle [cycle].

The reference block residual capacity Qsc in expression (2) is determined according to expression (4) given below.

$$Qsc = f2(Cs) \quad (4)$$

where f2(Cs): transform function for determining a current reference block residual capacity Qsc on the basis of a current reference block equivalent cycle Cs FIG. 7 is a graph illustrating the relationship between the residual capacities [Ah] and the equivalent cycles (the number of cycles) [cycles]. The graph shows that the residual capacity increases as discharges are repeated (with age). The residual capacities in FIG. 7 indicate the residual capacities of electric cells. The residual capacities of blocks can be determined by conversion from the residual capacities of the electric cells. According to FIG. 7, therefore, the current reference block residual capacity (Qsc) can be determined on the basis of the equivalent cycle (Cs) of the current reference block.

In the same manner, the target block depth of discharge Qon and the target block residual capacity Qoc are determined as shown below, and the used capacity of the target block Qo in the aforesaid expression (1') is calculated according to expression (5) given blow when the single-phase region is reached after completion of a charge/discharge.

$$Qo = Qon - Qoc \quad (5)$$

where
Qon: target block depth of discharge [Ah]
Qoc: target block residual capacity [Ah]

The target block depth of discharge Qon [Ah] in expression (5) is determined according to expression (6') given below. In expression (6'), "us" denotes the number of healthy strings 32 (initial value: 12) constituting a reference block.

$$Qon = us \times f3(Vo(0.5, T, Icd)) \quad (6')$$

where f3(Vo(0.5, T, Icd)): transform function for determining the depth of discharge of a (target) block 33 on the basis of a voltage Vo [V] of the block 33 on which the number of healthy strings is to be determined (The voltage [V] is to be obtained by converting into a stable open-circuit voltage [V] on the basis of an unstable open-circuit voltage [V] measured after 30 minutes (0.5 hours) following completion of a charge/discharge in the single-phase region and then correcting the converted stable open-circuit voltage [V] on the basis of a temperature T[° C.] upon completion of the charge/discharge and a charging/discharging current Icd[A] upon completion of the charge/discharge.)

The conversion from the 30-minute rest OCV to the 2-hour rest OCV by using FIG. 4, the correction based on the temperature T by using FIG. 5, and the correction based on the charging/discharging current Icd by using FIG. 6 are the same as the aforesaid case where the reference block depth of discharge has been determined (the description will be omitted).

The voltage of the target block is determined as described above and the determined voltage [V] is converted into a depth of discharge [Ah]. Since the voltage has been measured in the single-phase region, the voltage [V] can be converted into the depth of discharge [Ah] (refer to FIG. 2). The obtained depth of discharge (capacity) is based on the voltage of the block 33, so that it is equal to the capacity of one string 32. Thus, multiplying the depth of discharge by 12, which is the number of the strings 32, determines the depth of discharge [Ah] of the block 33 on which the number of healthy strings is to be determined. This is the target block depth of discharge Qon [Ah].

The target block residual capacity Qoc in expression (5) is determined according to expression (7) given below.

$$Qoc = f4(Co) \quad (7)$$

where f4(Co): transform function for determining a current target block residual capacity Qoc on the basis of a current target block equivalent cycle Co In the same manner as that of the aforesaid case where the reference block residual capacity (Qsc) is determined, the current target block residual capacity (Qoc) can be determined on the basis of the equivalent cycle (Co) of the current target block by using FIG. 7.

EXAMPLES

The following will describe the present invention in further detail by examples; however, the present invention is not limited to the embodiments.

Example 1

A sodium-sulfur battery (module) formed of four blocks A1, B1, C1 and D1 was used. Each block is composed of twelve strings, and each of the strings is composed of eight electric cells. The initial value of the number of healthy strings (of a reference block) is 12.

When 241 cycles elapsed since the start of use, the open-circuit voltage (30-minute rest OCV) of each block was measured after 30 minutes passed since completion of a discharge. The measurement result indicated that the voltage of the block A1 was the highest, so that the block A1 was selected as the reference block. Then, the (still unstable) voltage of each block was converted into a stable voltage (2-hour rest OCV), which was further subjected to a correction based on temperature and a correction based on a charging/discharging current, thus determining the depth of discharge of each block from the corrected voltage value (refer to expressions (3) and (6)). Further, from FIG. 7, the residual capacity of electric cells based on the 241 cycles was determined, and conversion from the determined residual capacity was implemented to determine the residual capacity of the block, which was 556 Ah (refer to expressions (4) and (7)). Subsequently, the residual capacity of each block was subtracted from the depth of discharge of each block to determine the used capacity of each block (refer to expressions (2) and (5)).

Based on the used capacity of each block, which had been obtained, the numbers of healthy strings of the blocks B1, C1 and D1, except for the reference block A1, were calculated according to expression (1). The results together with the blocks, the converted 30-minute rest OCVs of electric cells, the depths of discharge of the blocks, and the used capacities of the blocks are shown in Table 1.

TABLE 1

| | 30-minute Rest OCV [V] | | Depth of Discharge of Block [Ah] | Used Capacity of Block [Ah] | Number of Healthy Strings |
|---|---|---|---|---|---|
| | Block | Electric Cell | | | |
| Block A1 | 16.39 | 2.04875 | 6556 | 6000 | 12.00 |
| Block B1 | 16.30 | 2.03750 | 6694 | 6138 | 11.73 |
| Block C1 | 16.10 | 2.01250 | 7001 | 6445 | 11.02 |
| Block D1 | 16.00 | 2.00000 | 7154 | 6598 | 10.72 |

When the failure determination value is set to 10, there is no block having its number of healthy strings of 10 or less according to the results shown in Table 1, so that it can be determined that the sodium-sulfur battery is not faulty (no failure has been detected).

Example 2

A sodium-sulfur battery (module) formed of four blocks A2, B2, C2 and D2 was used. Each block is composed of twelve strings, and each of the strings is composed of eight electric cells. The initial value of the number of healthy strings (of a reference block) is 12.

When 241 cycles elapsed since the start of use, the open-circuit voltage (30-minute rest OCV) of each block was measured after 30 minutes passed since completion of a discharge. The measurement result indicated that the voltage of the block A2 was the highest, so that the block A2 was selected as the reference block. Then, the (still unstable) voltage of each block was converted into a stable voltage (2-hour rest OCV), which was further subjected to a correction based on temperature and a correction based on a charging/discharging current, thus determining the depth of discharge of each block from the corrected voltage value (refer to expressions (3) and (6)). Further, from FIG. 7, the residual capacity of electric cells based on the 241 cycles was determined, and conversion from the determined residual capacity was implemented to determine the residual capacity of the block, which was 556 Ah (refer to expressions (4) and (7)). Subsequently, the residual capacity of each block was subtracted from the depth of discharge of each block to determine the used capacity of each block (refer to expressions (2) and (5)).

Based on the used capacity of each block, which had been obtained, the numbers of healthy strings of the blocks B2, C2 and D2, except for the reference block A2, were calculated according to expression (1). The results together with the blocks, the converted 30-minute rest OCVs of electric cells, the depths of discharge of the blocks, and the used capacities of the blocks are shown in Table 2.

TABLE 2

| | 30-minute Rest OCV [V] | | Depth of Discharge of Block [Ah] | Used Capacity of Block [Ah] | Number of Healthy Strings |
|---|---|---|---|---|---|
| | Block | Electric Cell | | | |
| Block A2 | 16.39 | 2.04875 | 6556 | 6000 | 12.00 |
| Block B2 | 16.30 | 2.03750 | 6694 | 6138 | 11.73 |
| Block C2 | 15.50 | 1.93750 | 7921 | 7365 | 9.77 |
| Block D2 | 16.20 | 2.02500 | 6847 | 6291 | 11.44 |

When the failure determination value is set to 10, the number of healthy strings of the block C2 is 10 or less according to the results given in Table 2, so that it can be determined that the sodium-sulfur battery has failed (a failure has been detected).

INDUSTRIAL APPLICABILITY

The method for calculating the number of healthy strings of a sodium-sulfur battery and the failure detection method using the same in accordance with the present invention can be ideally used as the means for perceiving the state of a sodium-sulfur battery used in application fields, such as load leveling, measures against a momentary drop in electric power, and compensation for fluctuations in the electric power generated by a renewable energy generating device, and for determining a failure of the sodium-sulfur battery.

DESCRIPTION OF REFERENCE NUMERALS

3: sodium-sulfur battery
31: electric cell
32: string
33: block
34: module

The invention claimed is:

1. A method for calculating the number of healthy strings of a sodium-sulfur battery, comprising:
    forming a string of the sodium-sulfur battery by connecting an S number of electric cells, which is a plural number, in series;
    connecting a U number of the strings, which is a plural number, in parallel to form a block;
    connecting an N number of the blocks, which is a plural number, in series, and
    determining in a control unit a number uo of healthy strings of a block in a sodium-sulfur battery according to expression (1) given below:

$$uo = (Qs/Qo) \times us \qquad (1)$$

where
    Qs: used capacity of reference block;
    Qo: used capacity of target block; and
    us: number of healthy strings of reference block (us≤u).

2. The method for calculating the number of healthy strings of a sodium-sulfur battery according to claim 1, further comprising:
    calculating in the control unit a used capacity Qs of a reference block and a used capacity Qo of a target block after the completion of a charge/discharge using expressions (2) through (5) given below:

$$Qs = Qsn - Qsc \qquad (2)$$

where:
    Qsn: depth of discharge of reference block;
    Qsc: residual capacity of reference block; and $$Qsn = us \times f1(Vs(t,T,Icd)) \qquad (3)$$

where:

f1(Vs(t, T, Icd)) is a transform function for determining the depth of discharge of a block having a highest voltage on the basis of a voltage Vs of the block, wherein the voltage is obtained by converting an unstable open-circuit voltage measured t hours following completion of a charge/discharge in the single-phase region into a stable open-circuit voltage, and then correcting the converted stable open-circuit voltage on the basis of a temperature T upon completion of a charge/discharge and a charging/discharging current Icd upon completion of a charge/discharge;

$$Qsc = f2(Cs) \quad (4)$$

where:

f2(Cs) is a transform function for determining a current reference block residual capacity Qsc on the basis of an equivalent cycle Cs of a current reference block;

$$Qo = Qon - Qoc \quad (5)$$

where:

Qon: depth of discharge of target block;
Qoc: residual capacity of target block; and $$Qon = us \times f3(Vo(t,T,Icd)) \quad (6)$$

where:

f3(Vo(t, T, Icd)) is a transform function for determining the depth of discharge of a block, the number of healthy strings of which is to be determined, on the basis of a voltage Vo of the block, wherein the voltage is obtained by converting an unstable open-circuit voltage measured t hours following completion of a charge/discharge in the single-phase region into a stable open-circuit voltage, and then correcting the converted stable open-circuit voltage on the basis of a temperature T upon completion of a charge/discharge and a charging/discharging current Ted upon completion of a charge/discharge; and $$Qoc = f4(Co) \quad (7)$$

where:

f4(Co) is a transform function for determining a residual capacity Qoc of a current target block on the basis of an equivalent cycle Co of the current target block.

3. A failure detection method for a sodium-sulfur battery, comprising determining in a control unit a value of a number uo of healthy strings in a block of sodium-sulfur batteries using the method according to claim 2 for calculating the number of healthy strings of a sodium-sulfur battery, and detecting a failure of a sodium-sulfur battery from the determined value of the number uo of healthy strings in a block of sodium-sulfur batteries.

4. The failure detection method for a sodium-sulfur battery according to claim 3, wherein the control unit is detecting the failure of a sodium-sulfur battery which constitutes an electric power storage-compensation device to compensate for output fluctuations in an electric power generating device in an interconnected system, which combines the electric power generating device incurring output fluctuations and the electric power storage-compensation device to supply power to a power system.

5. A failure detection method for a sodium-sulfur battery, comprising determining in a control unit a value of a number uo of healthy strings in a block of sodium-sulfur batteries using the method according to claim 1 for calculating the number of healthy strings of a sodium-sulfur battery, and detecting a failure of a sodium-sulfur battery from the determined value of the number uo of healthy strings in a block of sodium-sulfur batteries.

6. The failure detection method for a sodium-sulfur battery according to claim 5, wherein the control unit is detecting the failure of a sodium-sulfur battery which constitutes an electric power storage-compensation device to compensate for output fluctuations in an electric power generating device in an interconnected system, which combines the electric power generating device incurring output fluctuations and the electric power storage-compensation device to supply power to a power system.

* * * * *